(12) United States Patent
Kim

(10) Patent No.: US 7,312,132 B2
(45) Date of Patent: Dec. 25, 2007

(54) FIELD INSULATOR FET DEVICE AND FABRICATION METHOD THEREOF

(75) Inventor: Jea-Hee Kim, Kyungki-do (KR)

(73) Assignee: Dongbu Electronics Co., Ltd., Seoul (KR)

( * ) Notice: Subject to any disclaimer, the term of this patent is extended or adjusted under 35 U.S.C. 154(b) by 198 days.

(21) Appl. No.: 10/924,817

(22) Filed: Aug. 25, 2004

(65) Prior Publication Data

US 2005/0139927 A1 Jun. 30, 2005

(30) Foreign Application Priority Data

Dec. 30, 2003 (KR) ............... 10-2003-0100932

(51) Int. Cl.
 *H01L 21/762* (2006.01)
(52) U.S. Cl. .................... 438/424; 438/444
(58) Field of Classification Search ........... 438/424, 438/444
 See application file for complete search history.

(56) References Cited

U.S. PATENT DOCUMENTS

| 6,599,813 | B2 * | 7/2003 | Beyer et al. ............ 438/424 |
| 6,716,691 | B1 * | 4/2004 | Evans et al. ............ 438/218 |
| 6,737,723 | B2 * | 5/2004 | Farrar ................... 257/510 |
| 2002/0047169 | A1 * | 4/2002 | Kunikiyo .............. 257/410 |
| 2004/0209438 | A1 * | 10/2004 | Saito et al. ............ 438/424 |
| 2006/0046355 | A1 * | 3/2006 | Parekh et al. .......... 438/149 |

OTHER PUBLICATIONS

Choi et al., "Sub-20nm CMOS FinFET Technologies," *IEDM Technical Digest. International*, Electron Devices Meeting, Dec. 2001, pp. 421-423.
Lee et al., "Hydrogen Annealing Effect on DC and Low-Frequency Noise Characteristics in CMOS FinFETs," *IEEE Electron Device Letters*, vol. 24, No. 3, Mar. 2003, pp. 186-188.

* cited by examiner

*Primary Examiner*—M. Wilczewski
(74) *Attorney, Agent, or Firm*—Pillsbury Winthrop Shaw Pittman LLP

(57) ABSTRACT

A FinFET and a fabrication method thereof. The FinFET device includes an SOI substrate realized through a substrate, a buried oxide layer formed on the substrate, and a silicon epitaxial layer formed on predetermined areas of the buried oxide layer. A gate oxide layer is formed on the silicon epitaxial layer, and a gate electrode is formed on the gate oxide layer. A field insulator is formed on exposed areas of the buried oxide layer to thereby separate adjacent silicon epitaxial layers. Side surfaces of the silicon epitaxial layer are flattened through heat treatment. The fabrication method for a FinFET device includes forming the gate oxidation layer and the gate electrode on the SOI substrate; forming the mask pattern on the gate electrode; forming the trench by etching using the mask pattern as a mask; performing heat treatment to flatten the side surfaces of the silicon epitaxial layer; and forming the field insulator in the trench.

10 Claims, 3 Drawing Sheets

FIELD INSULATOR FET DEVICE AND FABRICATION METHOD THEREOF

PRIORITY INFORMATION

This application claims priority from Korean Patent Application No. 2003-0100932, filed Dec. 30, 2003, the contents of which are herein incorporated by reference in its entirety.

BACKGROUND

1. Field of Invention

The present invention relates to a semiconductor device and a fabrication method thereof. More particularly, the present invention relates to a semiconductor device and a fabrication method thereof in which a device isolation layer is formed in a field region of a silicon on insulator (SOI) substrate for a field insulator field effect transistor (FinFET) device.

2. Description of Related Art

The application of nano-complementary metal-oxide-semiconductor (CMOS) device technology to memory devices, such as central processing units (CPUs), results in substantial added value. Nano-CMOS is relatively new technology and substantial research is being performed throughout the world as a result of the added value that may be obtained. A FinFET device is an example of a device produced using nano-CMOS technology.

Conventional techniques for fabricating FinFET devices are disclosed in Electron Devices Meeting (IEDM Technical Digest, International 2-5 December 2001, Pages 19.1.1-19.1.4) and Electron Device Letters (IEEE, Volume 24, Issue 3, March, 2003, Pages 186-188).

In the conventional FinFET manufacturing method, an elevated field insulator (LFIN) is used to form a device isolation layer in a field region of a silicon on insulator (SOI) substrate. An active region is formed in the SOI substrate through this process.

More particularly, a silicon substrate and an SOI substrate are first prepared. The SOI substrate includes a buried oxide layer and a silicon epitaxial layer. A gate oxide layer, a polycrystalline silicon layer, and a pad nitride layer are formed, in this sequence, on the SOI substrate. Next, using photolithography, the nitride layer is removed from the field region of the SOI substrate to thereby form a nitride layer pattern in the active region of the SOI substrate.

Following the above processes, the nitride layer pattern is used as a hard mask layer to perform etching of the polycrystalline silicon layer, the gate oxide layer, and the silicon epitaxial layer in areas outside of the nitride layer. A trench is formed through this process.

Next, gap filling using an insulation layer (e.g., an oxidation layer) is performed in the trench, after which the insulation layer is flattened through a process of chemical-mechanical polishing. Accordingly, a device isolation layer is formed in the field region of the SOI substrate to define an active region in the SOI substrate.

A drawback, however, of the above conventional method is as follows. As a result of the accumulation of the nitride layer on the polycrystalline silicon layer, flat vertical side surfaces of the nitride layer pattern are not achieved after forming the nitride layer pattern through photolithography. This is caused by diffused reflection occurring on the polycrystalline silicon layer during exposure to form a pattern of a photosensitive layer that corresponds to the pattern of the nitride layer.

If the nitride layer pattern formed with the above defect is used as an etching mask layer to perform dry etching (e.g., reactive ion etching) of the polycrystalline layer, the gate oxide layer, and the silicon epitaxial layer, striations may be formed in the silicon epitaxial layer. Other defects, such as facets, may also be generated in the silicon epitaxial layer.

FIG. 1 is a photograph taken by an electron microscope, and is used to observe etching surfaces of the silicon epitaxial layer, gate oxide layer, and the polycrystalline silicon layer. It is evident from the photograph that striations S are formed in the etched side surfaces.

Facets and striations may cause an increase in a leakage current of a junction formed in the active region of the SOI substrate, and may otherwise degenerate the characteristics of the transistor used for a FinFET device.

SUMMARY

In one embodiment of the present invention, there is provided a fabrication method of a semiconductor device in which defects, such as, facets and striations, are prevented from being formed in a silicon epitaxial layer of an SOI substrate, and a device isolation layer for a FinFET device is formed in a field region of the SOI substrate.

Further, there is provided a fabrication method of a semiconductor device that reduces a leakage current of a junction to thereby prevent a degeneration of characteristics of a transistor for a FinFET device.

In one embodiment of the present invention, a FinFET device includes a silicon on insulator substrate realized through a substrate, a buried oxide layer formed on the substrate, and a silicon epitaxial layer patterned to be formed on predetermined areas of the buried oxide layer, a gate oxide layer formed on the silicon epitaxial layer, a gate electrode formed on the gate oxide layer, and a field insulator formed on areas of the buried oxide layer, where the silicon epitaxial layer is not present on the buried oxide layer to thereby separate adjacent silicon epitaxial layers.

The defects, such as, striation and facet regions of the side surfaces of the silicon epitaxial layer, are flattened by the heat treatment. In other words, defects, such as, facets and striations, are prevented from being formed. As noted above, the striation and facet regions defects cause leakage current in the FinFET device.

In one embodiment, the heat treatment is performed in one of a hydrogen gas atmosphere and a heavy hydrogen gas atmosphere, and at a temperature of about 850 to about 1150° C.

In one embodiment, an upper surface of the field insulator opposite a surface closest to the buried oxide layer is higher than an upper surface of the gate electrode opposite a surface closest to the gate oxide layer. The upper surface of the field insulator opposite a surface closest to the buried oxide layer is flattened through chemical-mechanical polishing.

In one embodiment, the gate electrode is a polycrystalline silicon layer.

The fabrication method for a FinFET device includes forming a gate oxidation layer and a gate electrode (in this sequence) on a silicon on insulator substrate that includes a substrate, a buried oxide layer, and a silicon epitaxial layer, forming a mask pattern on the gate electrode, forming a trench by etching exposed side surfaces of the gate electrode, the gate oxide layer, and the silicon epitaxial layer using the mask pattern as a mask, performing a heat treatment to flatten the etched side surfaces of the silicon epitaxial layer, and forming a field insulator in the trench.

A nitride layer may be used as the mask pattern. In one embodiment, the mask pattern exposes the gate electrode at areas of a predetermined field region, which is a device isolation region.

The forming the mask includes forming a mask pattern, forming a nitride layer on the gate electrode, forming a photoresist pattern on the nitride layer that exposes the nitride layer at areas of a predetermined field region, which is a device isolation region, and etching exposed portions of the nitride layer using the photoresist pattern as a mask, thereby forming a nitride layer pattern.

In the forming a trench, dry etching such as reactive ion etching is used to etch exposed areas of the gate electrode, the gate oxide layer, and the silicon epitaxial layer.

The forming a field insulator in the trench includes forming a field insulator on the buried oxide layer and the mask pattern through the trench and performing chemical-mechanical polishing of the field insulator until the mask pattern is exposed.

BRIEF DESCRIPTION OF THE DRAWINGS

The accompanying drawings, which together with the specification, illustrate an exemplary embodiment of the present invention, and, together with the description, serve to explain the principles of the present invention.

DETAILED DESCRIPTION

Figure 1:
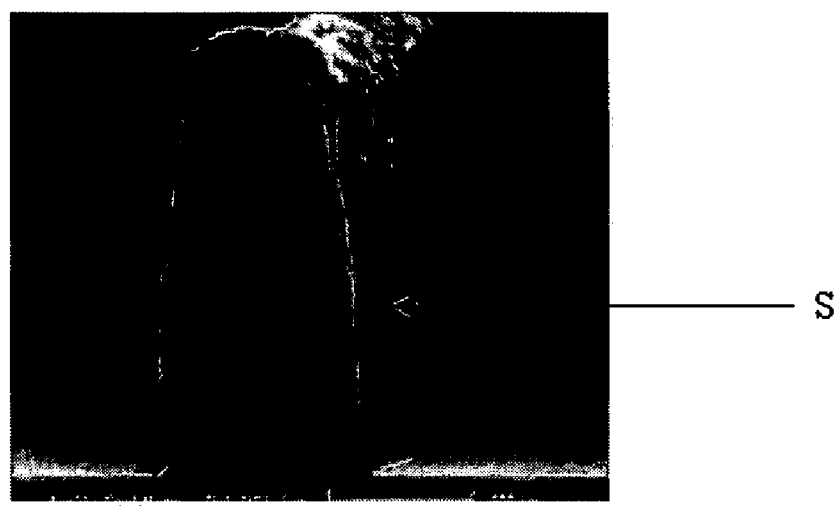
FIG. 1 is an electron microscope photograph showing striations formed in etched side surfaces of a silicon epitaxial layer, gate oxide layer, and a polycrystalline silicon layer.
Figure 2A:
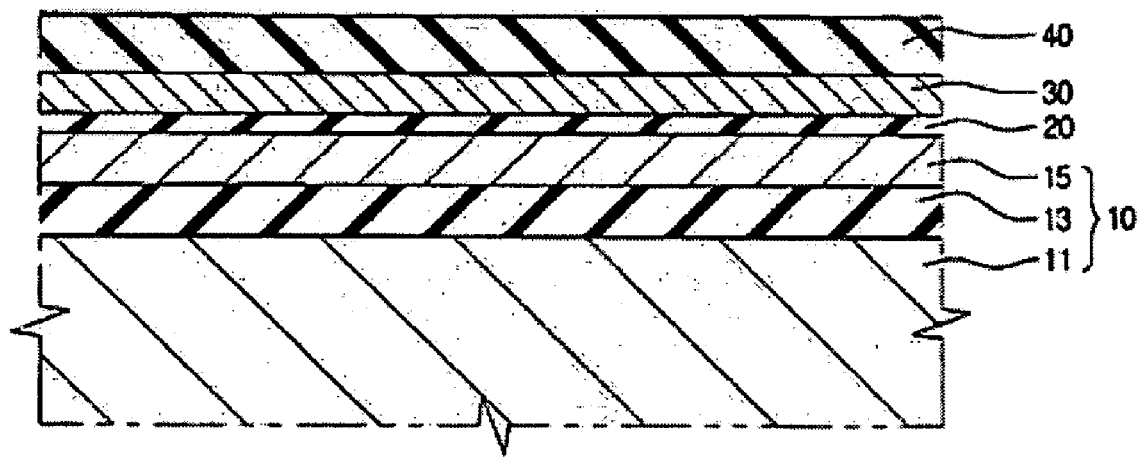
FIGS. 2A-2D are sectional views used to describe a method of fabricating a semiconductor device, according to embodiments of the present invention.

An embodiment of the present invention will now be described in detail with reference to the accompanying drawings. In particular, FIG. 2D provides a sectional view of a FinFET device, in accordance with an embodiment of the present invention. As illustrated, the FinFET device is formed on an SOI substrate 10, which includes a substrate 11, a buried oxide layer 13 formed on the substrate 11, and a silicon epitaxial layer 15 patterned to be formed on select areas of the buried oxide layer 13.

As discussed above, striations and facets may cause leakage current in the FinFET device. As such, the side surfaces of the patterned silicon epitaxial layer 15 are made planar by removing striation and facet regions by performing certain processes, such as, for example, a heat treatment. An exemplary heat treatment will be discussed in detail below.

In FIG. 2D, a gate oxide layer 20 and a gate electrode 30 are formed, in this sequence, on the silicon epitaxial layer 15. The gate electrode 30 may be a polycrystalline silicon layer. The gate oxide layer 20 and the gate electrode 30 are formed to substantially the same pattern as the silicon epitaxial layer 15.

Field insulators 70 are formed on the buried oxide layer 13 at areas where the silicon epitaxial layer 15 is not present on the buried oxide layer 13. The field insulators 70 isolate specific areas of the silicon epitaxial layer 15. Further, a mask pattern such as a nitride layer 40 is formed on the gate electrode 30. The nitride layer 40 is used when patterning the gate electrode 30, the gate oxide layer 20, and the silicon epitaxial layer 15.

An upper surface of the field insulators 70 (i.e., a surface opposite that adjacent to the buried oxide layer 13) is higher than an upper surface of the gate electrode 30 (i.e., a surface opposite that adjacent to the gate oxide layer 20). Chemical-mechanical polishing (CMP) may be used to form the he A fabrication method of a FinFET device according to an embodiment of the present invention will now be described. In FIG. 2A, an SOI substrate 10 is prepared. The SOI substrate 10 includes a polysilicon substrate 11, a buried oxide layer 13 formed on one surface of the polysilicon substrate 11, and a silicon epitaxial layer 15 formed on the buried oxide layer 13.

Next, using a thermal oxide process, for example, a gate insulation layer such as a gate oxide layer 20 is grown on an exposed surface of the SOI substrate 10. The gate oxide layer 20 is formed to a thickness of about 10-30 Å.

Following the above process, a conductive layer such as a polycrystalline silicon layer 30, for use as a gate electrode, is formed on the gate oxide layer 20. A low pressure chemical vapor deposition process may be used to form the polycrystalline silicon layer 30. In one embodiment, the polycrystalline silicon layer 30 is formed to a thickness of about 1500-2000 Å.

Next, an insulation layer such as a nitride layer 40 is formed on the polycrystalline silicon layer 30. The nitride layer 40 is used as a hard mask layer and is formed through a low pressure chemical vapor process to a thickness of about 1500-2000 Å.

Figure 2B:
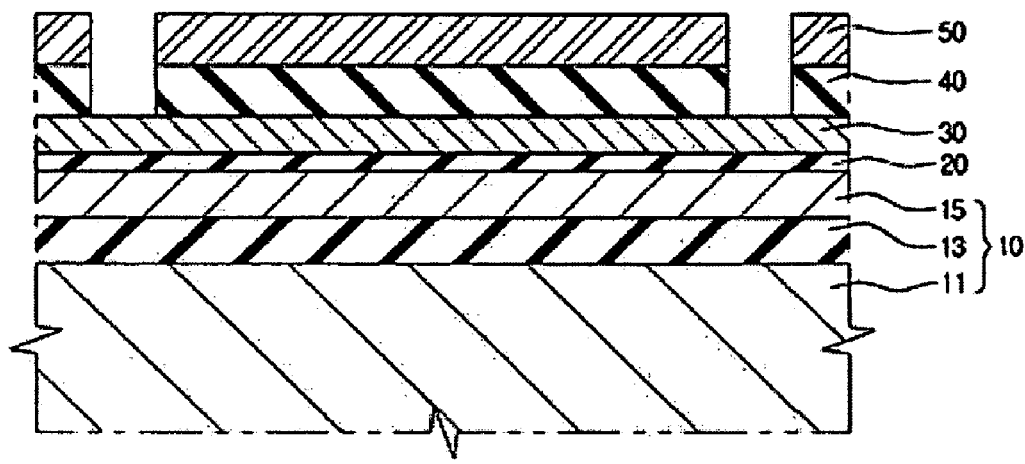

In FIG. 2B, an etching mask layer such as, for example, a photosensitive layer 50, is patterned on the nitride layer 40. The photosensitive layer 50 is used to expose the nitride layer 40 at predetermined areas designated as device isolation regions of the SOI substrate 10, and to mask remaining areas of the nitride layer 40 in an active region of the SOI substrate 10.

The pattern of the photosensitive layer 50 is used as a mask to remove the exposed areas of the nitride layer 40. Dry etching such as, for example, reactive ion etching, may be used to perform this process. Accordingly, a pattern of the nitride layer 40 is formed on the active region of the SOI substrate 10, and the polycrystalline silicon layer 30 is exposed on the field regions of the SOI substrate 10. Defects, such as striations, are formed along side surfaces of the etched nitride layer 40 at areas where the same is removed.

Figure 2C:
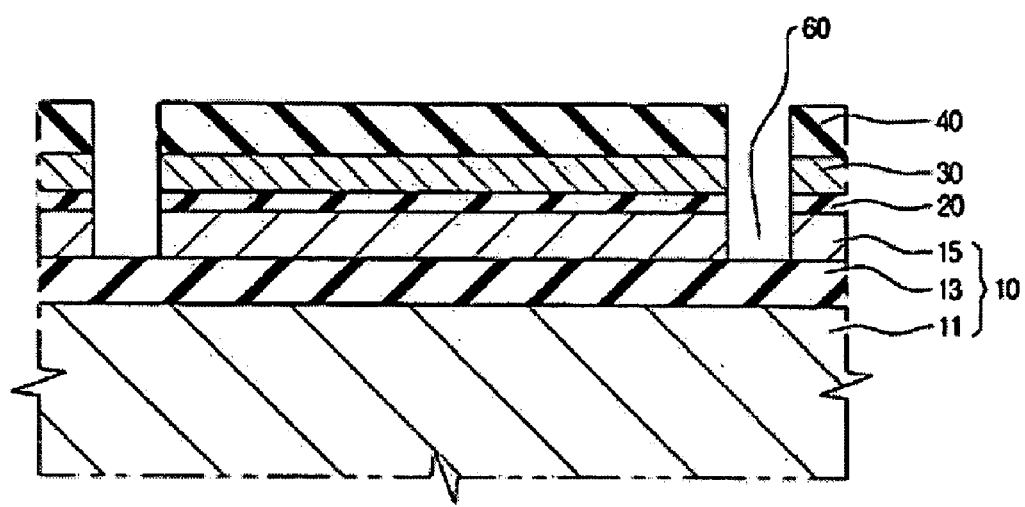
Figure 2D:
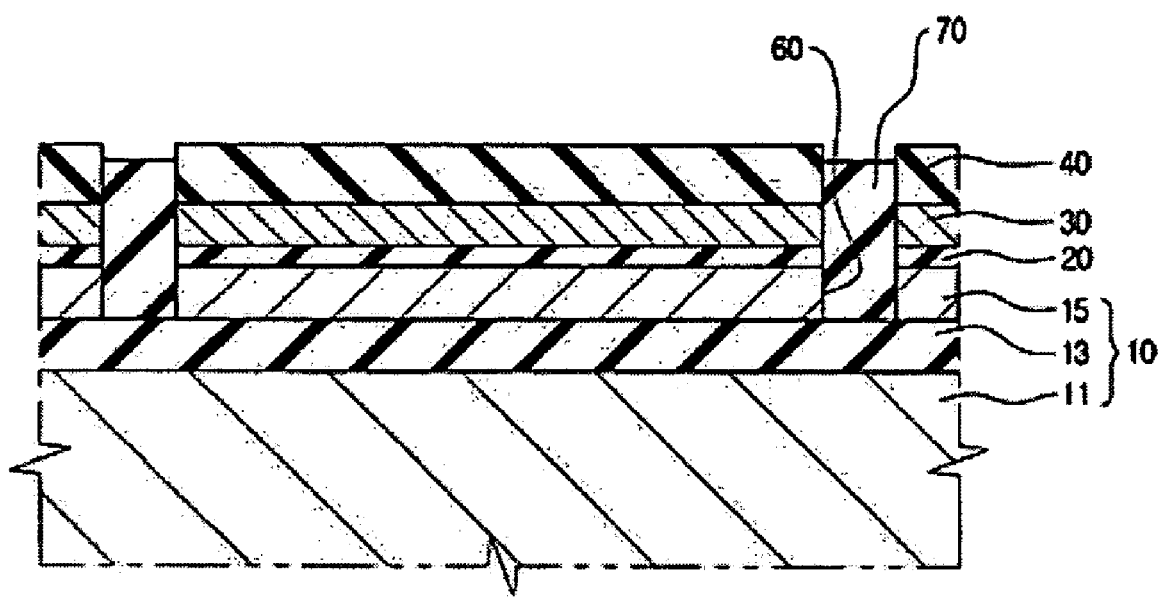

The photosensitive layer 50 is removed, as is illustrated in FIG. 2C. The pattern of the nitride layer 40 is then used as an etching mask layer to remove portions of the polycrystalline silicon layer 30, the gate oxide layer 20, and the silicon epitaxial layer 15 corresponding to the pattern of the nitride layer 40. This is performed using a dry etching process, such as, for example, reactive ion etching. Trenches 60 are formed through this process.

Defects, such as, striations and facets, are formed on side surfaces of the silicon epitaxial layer 15 exposed in the trenches 60. As noted above, striations and facets may increase the leakage current of the junctions formed in the active region of the SOI substrate 10, and also degenerate the characteristics of the transistor for use as a FinFET device. It is, therefore, advantageous to remove the striations and facets, according to this embodiment of the invention.

In FIG. 2D, a process, such as a heat treatment, is formed on the SOI substrate 10 to remove the striations and facets of the silicon epitaxial layer 15. The heat treatment is performed in a hydrogen $H_2$ gas atmosphere or a heavy hydrogen $D_2$ gas atmosphere for a period of time, such as, for example, about 30-60 minutes. It will be appreciated that heavy hydrogen is an isotope of hydrogen having a mass number greater than 1. Since $D_2$ gas is more reactive than $H_2$ gas, it led to particularly good results in obtaining flatness of the side surfaces. However, the use of $H_2$ gas is also suitable within the scope of this invention.

In one embodiment, the heat treatment is performed at a temperature of about 850 to about 1150° C. If heat treatment is performed at a temperature of less than about 850° C., the striations and facets may not be removed, while if heat treatment is performed at a temperature exceeding about 1150° C., the silicon epitaxial layer 15 may experience re-crystallization. For certain applications, a narrower range of about 1050° C. to about 1150° C. has yielded better results.

Next, using high density plasma (HDP) chemical vapor deposition (CVD) or tetraethyl ortho silicate (TEOS) CVD, gap filling of the trenches 60 may be performed by depositing an oxide layer (for example) on the nitride layer 40 and within the trenches 60.

A process to perform flattening such as, for example, chemical-mechanical polishing (CMP), is then performed to flatten the oxide layer such that device isolation layers 70 (i.e., field insulators) realized through the oxide layer are formed in the trenches 60 and the nitride layer 40 is exposed at areas outside of the trenches 60. Therefore, the active region of the SOI substrate 10 is defined by the field insulators 70 of the field regions of the SOI substrate 10. It will be appreciated that what is meant and intended to mean by the term "flattening" is a process that endeavors to make the side surfaces more planar (i.e., more flush or smooth) to discourage the formation of defects, such as, striations and facets.

In the present invention, the striations and facets generated on the silicon epitaxial layer 15 are removed through the heat treatment. Therefore, with the formation of a transistor for use as a FinFET device in the active region, junction leakage current is reduced and a degeneration of the characteristics of the transistor is prevented.

In the fabrication method of a semiconductor device of the present invention described above, the gate oxidation layer, the polycrystalline silicon layer for use as a gate electrode, and the nitride layer are formed in this sequence on the SOI substrate. Photolithography is then used so that the nitride layer is left remaining only on the polycrystalline silicon layer of the active region, while all other portions of the nitride layer are removed.

Next, using the remaining nitride layer pattern as an etching mask layer, areas of the polycrystalline silicon layer, the gate oxide layer, and the silicon epitaxial layer of the SOI substrate outside of the nitride layer pattern are removed to thereby form trenches in the field regions of the SOI layer.

Subsequently, the striations and facets of the silicon epitaxial layer generated during the formation of the trenches are removed. This is performed using a heat treatment in a hydrogen $H_2$ or heavy hydrogen $D_2$ atmosphere. Finally, the field insulators are formed in the trenches to thereby define the active region of the SOI substrate.

As a result of the removal of the striations and facets of the silicon epitaxial layer, junction leakage current of the transistor for use as a FinFET device formed in the active region of the SOI substrate is reduced, and the characteristics of the transistor are enhanced. The reliability of the FinFET device is therefore ultimately improved.

Although an embodiment of the present invention has been described in detail hereinabove in connection with a certain exemplary embodiment, it should be understood that the invention is not limited to the disclosed exemplary embodiment—on the contrary, is intended to cover various modifications and/or equivalent arrangements included within the spirit and scope of the present invention, as defined by the appended claims.

I claim:

1. A method of fabricating a field insulator field effect transistor device, comprising:
    sequentially forming a gate oxide layer, a polycrystalline silicon layer and a nitride layer on a silicon on insulator substrate, the silicon on insulator substrate including a silicon layer, a buried oxide layer, and a silicon epitaxial layer;
    forming a mask pattern to pattern the nitride layer;
    forming a trench by patterning the polycrystalline silicon layer, the gate oxide layer, and the silicon epitaxial layer using the patterned nitride layer as a mask;
    performing a heat treatment to remove striations and facets formed on the etched side surface of the silicon epitaxial layer; and
    forming a field insulator in the trench,
    wherein the heat treatment is performed at a temperature of about 850° C. to about 1150° C. and in one of a hydrogen gas atmosphere and a heavy hydrogen gas atmosphere.

2. The fabrication method of claim 1, wherein the heavy hydrogen gas atmosphere is a deuterium $D_2$ gas atmosphere.

3. The fabrication method of claim 1, wherein the heat treatment is performed at a temperature in a range of about 1050° C. to about 1150° C.

4. The fabrication method of claim 1, wherein striations and facets formed on the etched side surfaces of the silicon epitaxial layer are substantially removed by the heat treatment.

5. The fabrication method of claim 1, wherein the mask pattern exposes the gate electrode at areas of a predetermined field region, which is a device isolation region.

6. The fabrication method of claim 1, wherein forming the mask comprises:
    forming a nitride layer on the gate electrode;
    forming a photoresist pattern on the nitride layer that exposes the nitride layer at areas of a predetermined field region, which is a device isolation region; and
    etching exposed portions of the nitride layer using the photoresist pattern as a mask, thereby forming a nitride layer pattern.

7. The fabrication method of claim 1, wherein for forming the trench, dry etching is used to etch the exposed gate electrode, the gate oxide layer, and the silicon epitaxial layer.

8. The fabrication method of claim 1, wherein for forming the trench, reactive ion etching is used to etch the exposed gate electrode, the gate oxide layer, and the silicon epitaxial layer.

9. The fabrication method of claim 1, wherein for forming the field insulator in the trench comprises:
    forming a field insulator on the exposed buried oxide layer through the trench and the mask pattern; and
    performing chemical-mechanical polishing of the field insulator until the mask pattern is exposed.

10. The fabrication method of claim 1, wherein a polycrystalline silicon layer is used as the gate electrode.

* * * * *